(12) United States Patent
Kaneko

(10) Patent No.: US 9,172,212 B2
(45) Date of Patent: Oct. 27, 2015

(54) TUNABLE SEMICONDUCTOR LASER DIODE

(75) Inventor: Toshimitsu Kaneko, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 13/115,301

(22) Filed: May 25, 2011

(65) Prior Publication Data
US 2011/0292955 A1 Dec. 1, 2011

(30) Foreign Application Priority Data

May 27, 2010 (JP) ................................. 2010-122136

(51) Int. Cl.
H01S 5/12 (2006.01)
H01S 5/0625 (2006.01)
B82Y 20/00 (2011.01)
H01S 5/026 (2006.01)
H01S 5/028 (2006.01)
H01S 5/042 (2006.01)
H01S 5/06 (2006.01)
H01S 5/343 (2006.01)

(52) U.S. Cl.
CPC .............. *H01S 5/06258* (2013.01); *B82Y 20/00* (2013.01); *H01S 5/028* (2013.01); *H01S 5/0265* (2013.01); *H01S 5/0425* (2013.01); *H01S 5/0612* (2013.01); *H01S 5/06256* (2013.01); *H01S 5/1209* (2013.01); *H01S 5/1212* (2013.01); *H01S 5/1215* (2013.01); *H01S 5/34306* (2013.01)

(58) Field of Classification Search
CPC ............ H01S 5/06258; H01S 5/06256; H01S 5/12–5/1218
USPC ....................... 372/20, 29.023, 50.11, 96, 102
See application file for complete search history.

(56) References Cited

U.S. PATENT DOCUMENTS

| 7,366,220 B2* | 4/2008 | Takabayashi | 372/102 |
| 2003/0128724 A1* | 7/2003 | Morthier | 372/20 |
| 2004/0218639 A1* | 11/2004 | Oh et al. | 372/20 |
| 2004/0228384 A1* | 11/2004 | Oh et al. | 372/96 |
| 2006/0209911 A1* | 9/2006 | Takabayashi | 372/20 |
| 2009/0310630 A1* | 12/2009 | Takabayashi | 372/20 |

FOREIGN PATENT DOCUMENTS

JP 7-273400 10/1995

* cited by examiner

*Primary Examiner* — Joshua King
(74) *Attorney, Agent, or Firm* — Smith, Gambrell & Russell LLP.

(57) ABSTRACT

A tunable LD with reduced number of the butt joint is disclosed. The tunable LD includes the reflector and a waveguide core. The reflector includes a plurality of segments each having a grating region and a space region adjacent to the grating region. The waveguide core includes a gain region extending in two segments adjacent to each other and a tuning region extending in two segments adjacent to each other and also adjacent to the segment for the gain region.

17 Claims, 9 Drawing Sheets

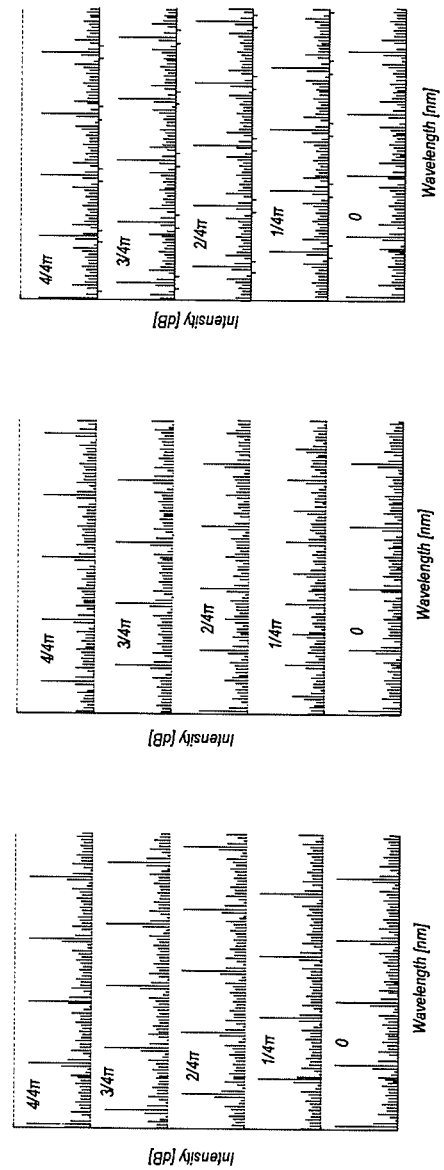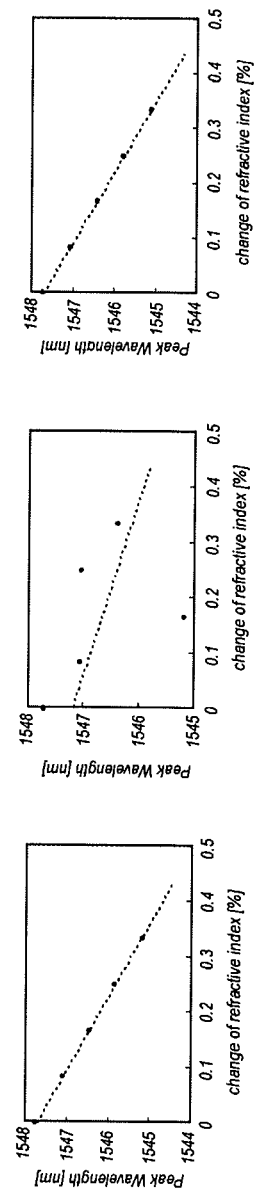
Fig. 4C
Fig. 4B
Fig. 4A

TUNABLE SEMICONDUCTOR LASER DIODE

BACKGROUND OF THE INVENTION

1. Field of the Invention

The present invention relates to a semiconductor laser diode (hereafter denoted as LD), in particular, the invention relates to a tunable LD.

2. Related Prior Art

A Japanese Patent Application published as JP-H07-273400A has disclosed a tunable LD having a sampled grating (hereafter denoted as SG) and an optical waveguide in which a plurality of gain regions and tuning regions are alternately arranged along the optical axis of the LD. Such a tunable LD may shift peak wavelengths appeared in the discrete spectrum caused by the SG by modifying the refractive index in the tuning region.

The tunable LD in the prior patent inevitably includes many interfaces between the gain region and the tuning region. Such an interface is often called as the butt-joint derived from the manufacturing process thereof. The butt-joint generally has an optically disarranged or discontinued interface to cause unintentional internal reflection thereat, which degrades the performance of the tunable LD. Accordingly, the number of the butt-joint should be reduced as possible.

SUMMARY OF THE INVENTION

An aspect of the present invention relates to a semiconductor laser diode that comprises a first reflector and a first waveguide core. The first reflector includes a plurality of segments each having a space region and a grating region. The grating region includes a diffraction grating, while, the space region without any diffraction grating is put between the grating regions. The first waveguide core, which optically couples with the first reflector, includes a gain region and a tuning region. The gain region extends in two of the segments adjacent to each other, and the tuning region extends in another two of the segments adjacent to each other and adjacent to the two segments involved in the gain region.

In one embodiment of the invention, the tuning region may have a length same with a length of the gain region, or may have a length from 0.4 to 1.0 relative to the length of the gain region.

The LD of the present invention may further include the second reflector optical coupled with the first reflector, and a second waveguide core optically couples with the second reflector and the first waveguide core. The second reflector may also include a plurality of grating regions and space regions alternately arranged to each other along the optical axis of the LD. The second waveguide core may include a gain region and a tuning region. The gain regions may also extend in two segments of the second reflector adjacent to each other, and the tuning region of the second waveguide core may extend in two segments adjacent to each other. Moreover, the second reflector may include two types of segments each having a specific optical length different from others.

BRIEF DESCRIPTION OF THE DRAWINGS

The foregoing and other purposes, aspects and advantages will be better understood from the following detailed description of a preferred embodiment of the invention with reference to the drawings, in which:

FIGS. 4A to 4C show behaviors of gain peaks depending on the variation of the refractive index in the tuning region;

DETAILED DESCRIPTION OF PREFERRED EMBODIMENTS

Next, some preferred embodiments according to the preset invention will be described as referring to accompanying drawings. In the description of the drawings, the same numerals or the symbols will refer to the same elements without overlapping explanations.

(First Embodiment)

Figure 1:
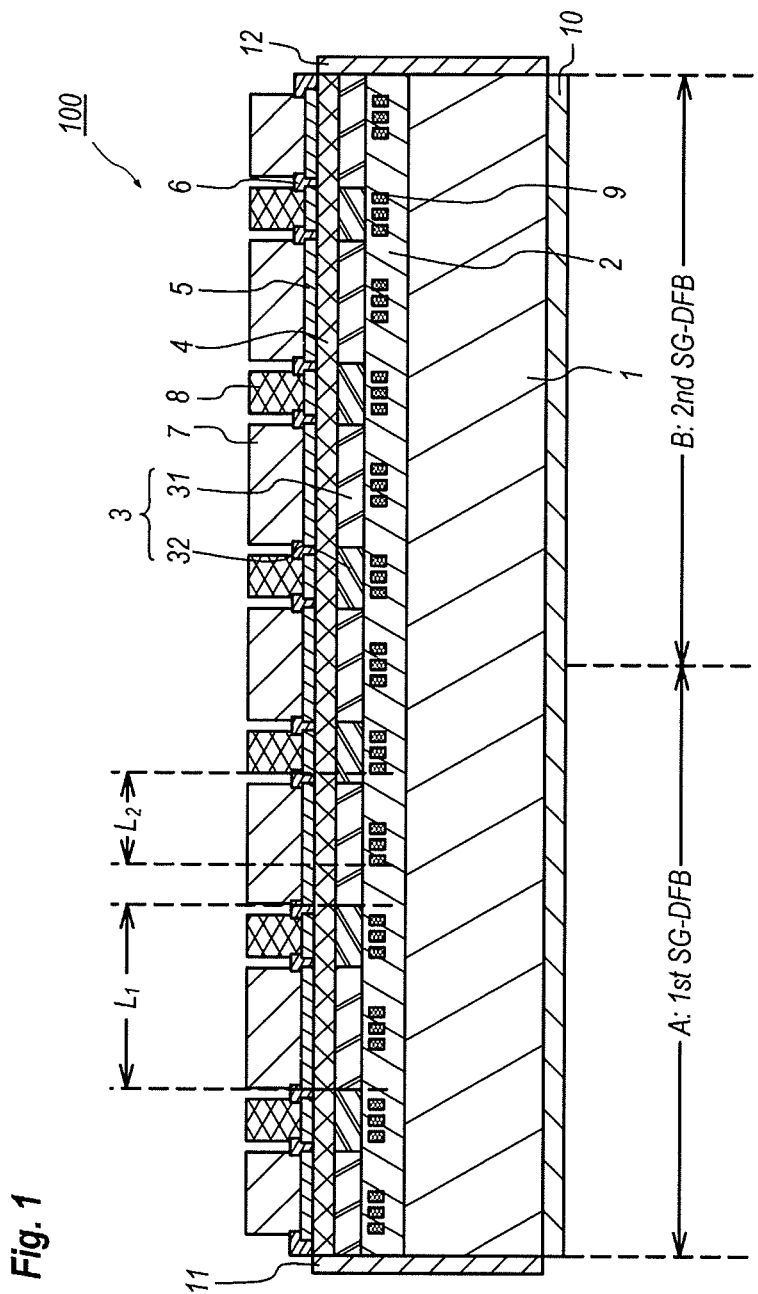
FIG. 1 is a cross section of a tunable LD according to the first embodiment of the present invention.

FIG. 1 is a cross section of an LD according to the first embodiment of the present invention. The LD 100 includes the first SG-DFB (Sampled Grating Distributed Feedback) region A and the second SG-DFB region B continuously coupled with the first SG-DFB region A. These first and second SG-DFB regions show the function of the optical cavity for the laser oscillation.

The first and second SG-DFB regions, A and B, each has a semiconductor stack on the substrate 1. The stack includes, from the bottom to the top, the lower cladding layer 2, the waveguide core 3, the upper cladding layer 4, and the contact layer 5. The waveguide core 3 comprises a plurality of the gain regions 31 and the tuning regions 32 alternately arranged to each other. The contact layer 5 is divided into many portions. The portions of the contact layer 5 above the gain region 31 and those above the tuning region 32 are electrically isolated to the others. An insulating layer 6 is put between the portions. Each of the portions above the gain region provides an electrode 7 to adjust the gain, while, the portions above the tuning region provide another electrode 8 to tune the refractive index.

The gain region 31 and the tuning region 32 each have an optical grating 9 in the lower cladding layer 2. Respective diffraction gratings 9 are formed so as to set a space to the next neighbor gratings, where respective spaces provide no diffraction grating. In the present embodiment, the diffraction grating means that a region with a relatively larger refractive index and another region with a relatively smaller refractive index are alternately arranged along the optical axis of the LD 100. The diffraction grating may have another arrangement, for instance, a semiconductor layer with a relatively larger refractive index with a corrugated surface thereof and another semiconductor layer with a relatively smaller refractive index fills respective valleys of the corrugation. Further specifically, two semiconductor layers having greater refractive index and smaller refractive index, respectively, are stacked so as to form a corrugated interface. The total length of one gain region 31 and one tuning region 32 is assumed to be $L_1$, while, the length of one segment is assumed to be $L_2$. As illustrated in the embodiment shown in FIG. 1, $L_1$ is at least two times greater than $L_2$, which is a feature of the present invention. Specifically, the gain region 31 in the waveguide core includes at least one grating region, and the tuning region 32 includes at least another one of the grating regions.

In the description below, the front side corresponds to a side where the first SG-DFB region A is formed, while, the rear side is assumed to a side of the second SG-DFB region B. The first and second SG-DFB regions, A and B, commonly provide the substrate 1, the loser cladding layer 2, the core waveguide 3, and the upper cladding layer 4 are continuously formed, that is, no interface is explicitly formed in respective layers, 1 to 5, between two regions, A and B.

The end facet of the first SG-DFB region A includes an anti-reflection (AR) coating 11 in the substrate 1, the lower cladding layer 2, the waveguide core 3, and the upper cladding layer 5. In other words, the AR coating 11 is formed in the front facet of LD 100. While, the end facet of the second SG-DFB region B also includes another AR coating 12 in the substrate 1, the lower cladding layer 2, the waveguide core 3, and the upper cladding layer 4 thereof; that is, the AR coating 12 is formed in the rear facet of the LD 100. The substrate 1 further provides in the back surface thereof a back electrode 10 continuously extending from the first SG-DFB region A to the second SG-DFB region B.

The substrate 1 may be made of indium phosphide (InP). The lower and upper cladding layers, 2 and 4, may confine light propagating within the waveguide core 3 in addition to a function to confine the carries to be injected within the waveguide core 3. The gain region 31 may have an arrangement of the multiple quantum well (MQW) structure; for instance, a plurality of well layers made of $Ga_{0.32}In_{0.68}As_{0.92}P_{0.08}$ and a plurality of barrier layers made of $Ga_{0.22}In_{0.78}As_{0.47}P_{0.53}$ are alternately stacked to each other. The tuning region 32 may have a waveguide made of $Ga_{0.28}In_{0.72}As_{0.61}P_{0.39}$ which is different from the composition of the well layers and that of the barrier layers.

The contact layer 5 may be made of $Ga_{0.47}In_{0.53}As$. A well known technique of the MOCVD (Metal Organized Chemical Vapor Deposition) may grow these semiconductor layers stacked on the InP substrate. The arrangement of the optical grating with the adjacent space may be formed by, for instance, an interference exposure technique, or other photo-lithography techniques. The insulating layer 6 may be an inorganic material such as silicone nitride (SiN), silicon oxide ($SiO_2$), and so on. The electrode 7 for adjusting gain and another electrode 8 for adjusting the refractive index may be made of metal, typically, gold (Au). Two AR coatings, 11 and 12, may be made of, for instance, magnesium fluoride ($MgF_2$), titanium oxi-nitride (TiON), and so on with the reflectivity thereof, which is sensed by the light propagating within the LD 100, less than 0.3%. Injecting carries within the tuning region 32, the refractive index thereof may equivalently shift by about 1.5% at the maximum.

Next, a practical operation of the LD 100 will be described. First, a temperature controller, which is not shown in the figures, sets a temperature of the LD 100 at a preset condition. Then, injecting a current, whose magnitude is determined in advance of the operation, into the gain electrode 7 concurrently with an application of an electrical signal to the tuning electrode 8, the laser oscillation may occur in the waveguide core 3 to emit the laser light. The electrical signal applied to the tuning electrode 8 may adjust the refractive index in the tuning region 32, which may also shift the peak wavelength of the reflectivity of the LD 100.

Although all of the gain waveguides 3 extends in at least two segments in the present embodiment, some of the gain waveguides 3 may be formed within a single segment; that is, some of the gain waveguides 3 may have a length $L_1$ less than the length $L_2$ of one segment. The arrangement, where all of the gain regions 31 extends in at least two segments and all of the tuning regions 32 extends in at least two segments, may minimize the number of the butt-joint between two regions, 31 and 32. As a matter of course, the gain region 31 and the tuning region 32 corresponding to the outermost segment may not extend in the neighbor segment.

As well known, the butt-joint is an interface between two materials heterogeneously to the others. The butt-joint in the present embodiment may be formed as follows: first growing the gain region 31 homogeneously on the lower cladding region 2; then, etching a portion of the gain region 31 where the tuning region is to be formed; and burying the etched portion by re-growing a material for the tuning region 32 which is heterogeneous to the material of the gain region 31. In this process, the interface between two materials suffers various factors, such as the shape of the etched gain region 31, the anomalous growth of the second growth for the tuning region 32, and so on, which degrades the quality of the interface apart from the ideal shape for the optical performance. Disordered shape of the interface leaves residual reflection thereat, and degraded crystal quality brings the increase of the threshold current and the decrease of the optical output power. The reduced number of the butt-joint results in the suppression of the degradation of the laser performance and the reduction of the reliability.

The reduction of the number of the butt-joint may also result in the decrease of the number of the gain electrode 7 and that of the tuning electrode 8, which may bring an another effect to suppress the possibility of the short-circuit between interconnections, which is inevitably accompanied with the shrink of the design rule. The present embodiment shown in FIG. 1 provides the gain region at the interface between the first SG-DFB region A the second SG-DFB region B. This gain region at the interface may show the optical gain in both of the first SG-DFB region A and the second SG-DFB region B.

Further, as already described, because no segment exists beyond the front facet of the first SG-DFB region A and beyond the rear face of the second SG-DFB region B, the gain region 31 and the tuning region 32 in the outermost segment do not extend in a neighbor segment.

Figure 2:
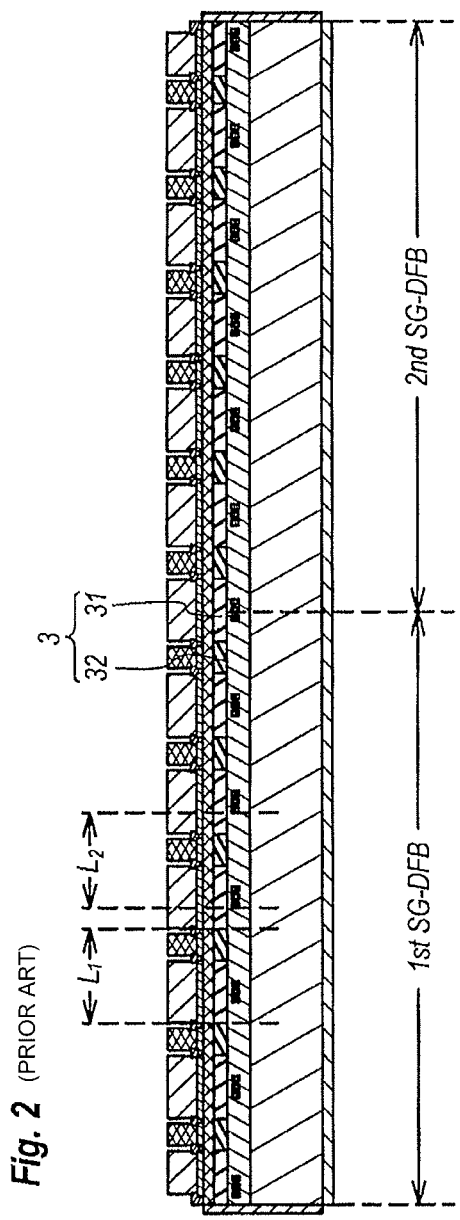
FIG. 2 is a comparable example of a tunable LD to describe the function of the present invention.

FIG. 2 shows another arrangement to compare the advantage of the present arrangement of the LD 100 shown in FIG. 1. That is, as shown in FIG. 2, the LD in FIG. 2 includes the first SG-DFB region and the second SG-DFB region continuously and smoothly connected to the others. One segment 3 in FIG. 2 only includes one gain region 31 and one tuning region 32. Accordingly, the number of butt-joint between the gain region 31 and the tuning region 32 with respect to the number of the segment inevitably increases, which degrades the performance and the reliability of the LD.

Figure 3:
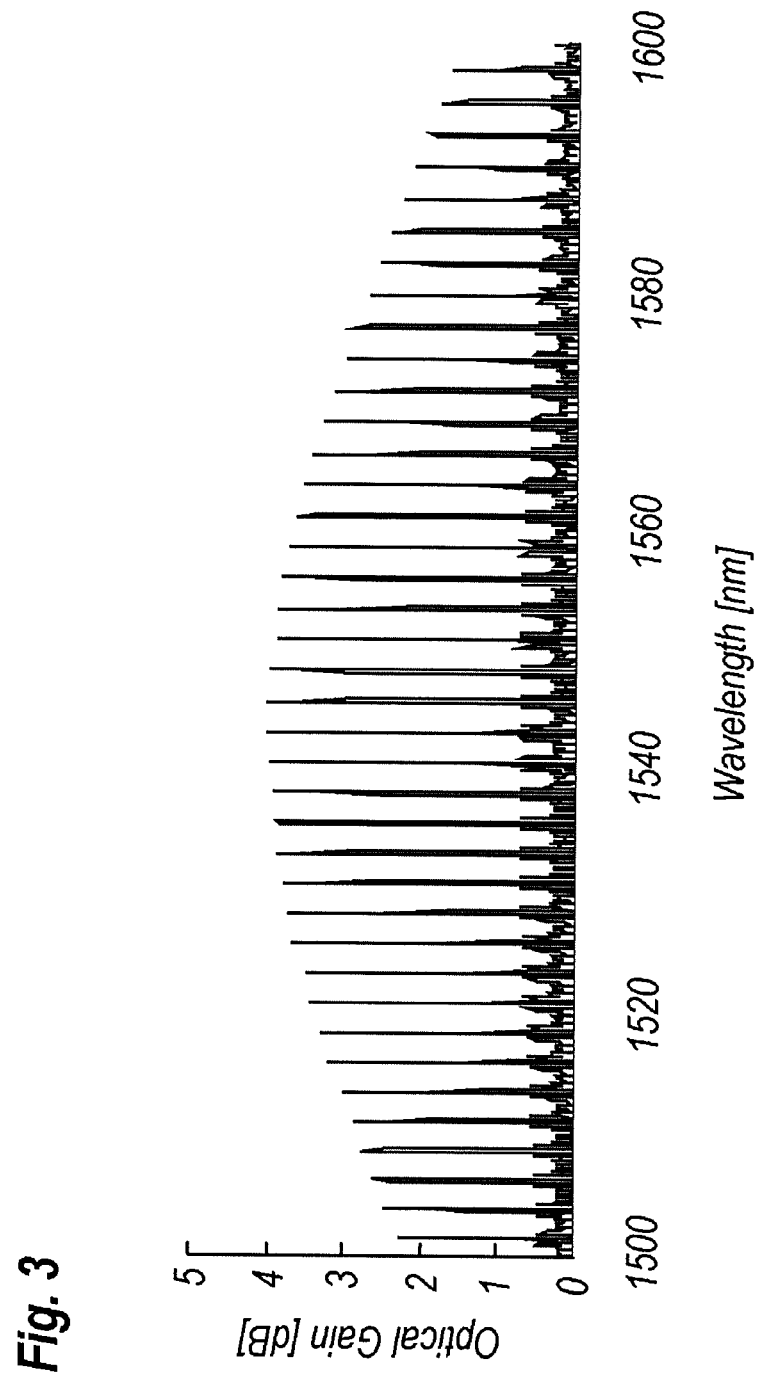
FIG. 3 shows a discrete gain spectrum generally obtained in the SG-DFB region.

Next, the function to tune an emission wavelength will be described. The LD illustrated in FIG. 2 shows a discrete gain spectrum as shown in FIG. 3. The envelope of the gain peaks is given by connecting the reflectivity of respective peaks each given by the following four equations:

$$R = |i\kappa(\sin h(\gamma L_{SG})/\{\gamma \cos h(\gamma L_{SG}) - (gth - i\delta)\sin h(\gamma L_{SG})\}|^2, \quad (1)$$

$$\kappa = \pi \Delta n_r / \lambda, \quad (2)$$

$$\gamma^2 = \kappa^2 + (g_{th} - i\delta)^2 \quad (3)$$

$$\delta \sim \beta - \beta_0 = 2\pi n_{SG}/\lambda - \pi/\Lambda, \quad (4)$$

where parameters appeared in the equations above have meanings below;

λ: emission wavelength
κ: coupling co-efficient
$L_{SG}$: length of the grating
$n_{SG}$: average refractive index of the optical grating
Λ: pitch of the corrugation in the optical grating
$g_{th}$: threshold gain
i: unit of imaginary part
γ: propagation constant along the direction of the optical cavity
δ: difference in propagation constant
$\Delta n_r$: difference of real part of refractive index in optical grating
β propagation constant eliminating optical loss
$\beta_0$: Bragg propagation constant.

The wavelength $\lambda_{Bragg}$ of the respective gain peaks is the Bragg wavelength of the diffraction grating, which is given by the equation (5) below using the average refractive index $n_{SG}$ and the pitch Λ:

$$\lambda_{Bragg} = 2\Lambda n_{SG}. \quad (5)$$

Moreover, the envelop connecting respective peaks shows a gradual reduction as the length of the optical grating $L_{SG}$ becomes shorter.

The segment of the present arrangement provides the optical grating 9 that includes 16 corrugations with a pitch of 0.24 μm, which means that the total length of the optical grating is 3.6 μm, and the space with a length of 67.2 μm. The peak wavelengths $\lambda_m$ of the discrete spectrum in FIG. 3 may be given by:

$$\lambda_m = 2n_{seg} L_{seg}/m, \quad (6)$$

where $n_{seg}$ and $L_{seg}$ are the average refractive index and the length of the segment; and m is an integer equal to or greater than unity (1). When the segment is comprised of the gain region and the tuning region, the average refractive index $n_{seg}$ may be given by:

$$n_{seg} = (n_G L_{Gain} + n_T L_{Tune})/(L_{Gain} + L_{Tune}), \quad (7)$$

where $n_G$, $n_T$, $L_{Gain}$, and $L_{Tune}$ are the equivalent refractive index of the gain region, that of the tuning region, the length of the gain region and that of the tuning region in a segment, respectively.

Although the SG-DFB region, A or B, may have a plurality of the gain regions 31 and the tuning regions 32, the present arrangement requires that a ratio of the length of the tuning region to that of the gain region be maintained in a unique value within the single SG-DFB region. When the ratio above described varies within the signal SG-DFB region, which also varies the equivalent refractive index $n_{seg}$ by equation (7), the peak wavelengths $\lambda_m$ becomes unstable, namely, indefinitely determined, according to equation (6).

FIGS. 4A, and 4B each reflects situations above described. FIG. 4A in the upper part thereof shows a gain spectrum of a SG-DFB region having a unique ratio of the length of the tuning region to that of the gain region. Under this condition, the peak wavelength $\lambda_m$ shifts by an equal amount for all peaks as varying the refractive index $n_T$ of the tuning region. Moreover, the peak wavelengths $\lambda_m$ continuously shift as the change of the refractive index $n_T$ of the tuning region by the carrier injection.

On the other hand, the peak wavelength sometimes shifts discontinuously depending on the length of the tuning region 32 as shown in FIG. 4B. For instance, when the ratio of the length of the tuning region 32 to that of the gain region 31 is different in respective segments, the average refractive index may be also different from others. This arrangement moderates the interference effect caused by the optical grating and sometimes eliminates the peaks. Under such a condition, the shift of the peak wavelength becomes discontinuous as shown in the lower part of FIG. 4B. Accordingly, the present embodiment is necessary, in order to tune the peak wavelength continuously, to set the ratio of the length of the tuning region to that of the gain region in a unique constant in all segments.

Under such a condition where the ratio described above is constant in a unique value in all segments, the condition to select one peak wavelength defined by equations (1) and (2) is satisfied. The LD of the present arrangement includes the optical gratings 9 alternately in the gain region 31 and the tuning region 32, which discriminates the Bragg diffraction wavelength in respective regions, 31 and 32. However, as described above, the optical grating with substantially shorter length may moderate the envelope of the gain peaks shown in FIG. 3 and restrict the shift amount of the wavelength peak within about 6 nm, which may not affect the behavior of the envelope of the gain peaks. Accordingly, the continuous shift of the peak wavelength may be obtained even for the arrangement of the LD of the present embodiment and the controllability of the peak wavelength may be enhanced.

Next, examples of the primary length $L_1$ and the segment length $L_2$ of the LD 100 will be described. Assuming that $L_1^{(1st)}$, $L_1^{(2nd)}$, $L_2^{(1st)}$ and $L_2^{(2nd)}$ are the primary length in the first SG-DFB region A, that of the second SG-DFB region B, the segment length in the first SG-DFB region A, and that in the second SG-DFB region B; and further assuming that conditions below are satisfied;

$$L_2^{(2nd)} > L_2^{(1st)}, \quad (8)$$

$$L_1^{(1st)} = 2 \times L_2^{(1st)}, \quad (9)$$

$$L_1^{(2nd)} = 2 \times L_2^{(2nd)}. \quad (10)$$

Thus, a condition where $L_1$ is at least two times greater than $L_2$ is satisfied in the assumption above.

We still further assume that $L_1^{(1st)}$ and $L_1^{(2nd)}$ are 70.8 μm and 75.6 μm, respectively, to obtain a tunable light source in the C-band for the WDM communication, while the pitch of the grating 9 is set such that the Bragg wavelength in both regions, 31 and 32, becomes 1.54 μm. The equivalent length of the tuning region 32 is selected in a range from 0.4 to 1.0 relative to the length of the gain region 31, which is preferable for the gain region to show a substantial optical gain. The ratio thus selected is uniform in all segments.

Figure 5A:
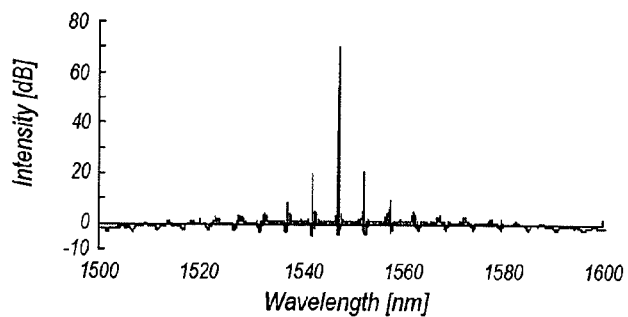
FIGS. 5A to 5C show behaviors of the laser emission of the tunable LD according to the embodiment of the present invention.
Figure 5B:
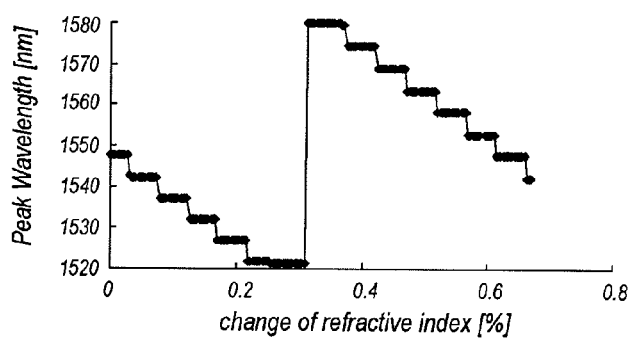
Figure 5C:
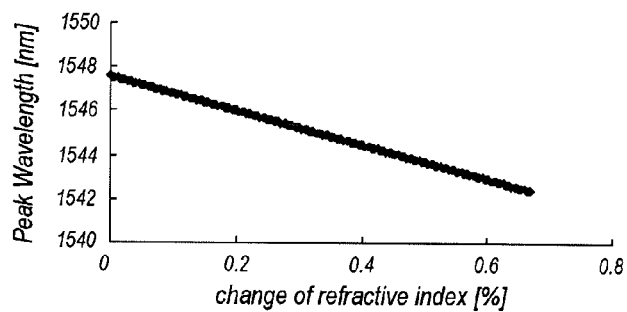

FIG. 5A is an emission spectrum under a condition where no current is injected into the tuning region 32. Because the first SG-DFB region A and the second SG-DFB region B each shows the discrete gain spectrum like those shown in FIG. 2 but the pitch between peaks of the region A is different from the pitch between peaks of the region B; accordingly, the LD may oscillate only at the wavelength where the gain peaks in respective regions, A and B, coincide with respect to the others. The coincided wavelength may be available by varying the equivalent refractive index of the second SG-DFB region B by injecting carriers in the tuning region 32 thereof. FIG. 5B shows the shift of the coincided wavelength against the change of the equivalent refractive index in the tuning region 32, which shows a step-like change of the coincided wavelength. Moreover, varying the equivalent refractive index of the tuning region 32 in the first SG-DFB region A independently on the second SG-DFB region B, the coincided wavelength may show a linear dependence on the change of the refractive index as shown in FIG. 5C.

(Second Embodiment)

Figure 6:
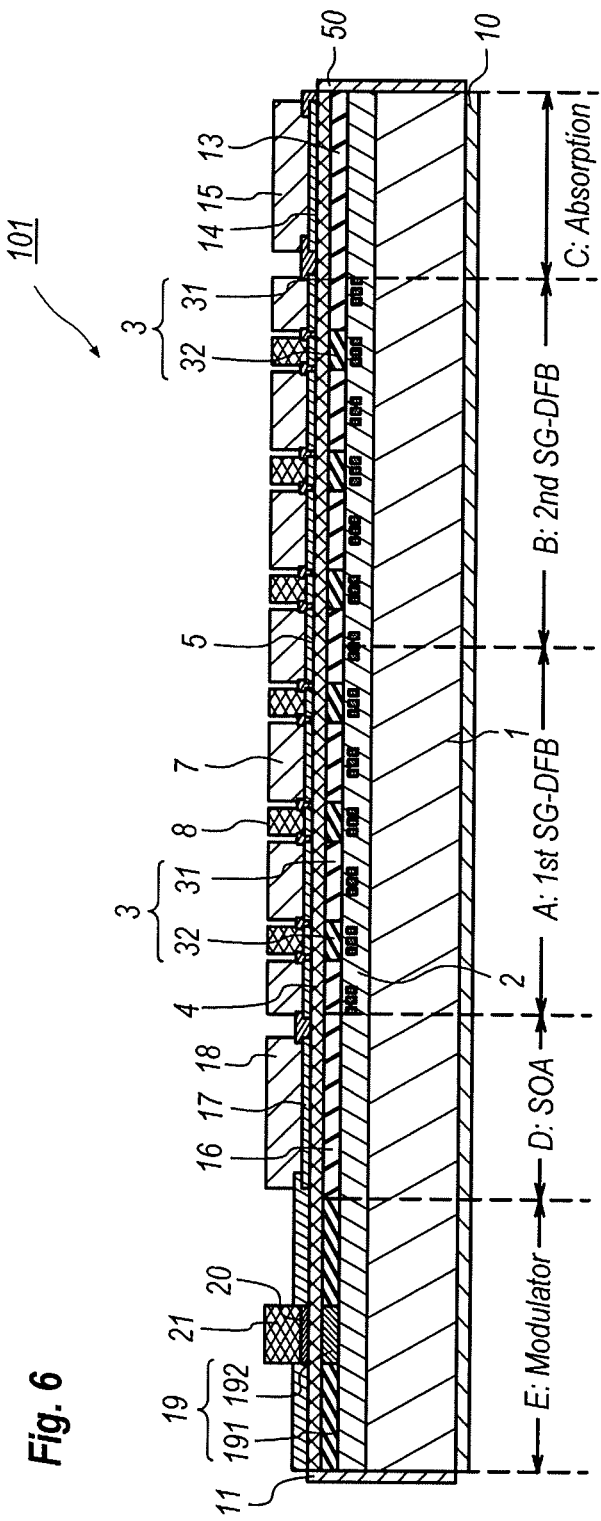
FIG. 6 is a cross section of another tunable LD according to the second embodiment of the invention.

FIG. 6 shows a cross section of another tunable LD 101 according to the second embodiment of the invention. The LD 101 includes, in addition to the arrangement of the former LD 100 shown in FIG. 1, a optical absorption region C, a amplifying region (hereafter denoted as SOA, which means the semiconductor optical amplifier), and an optical modulator E. The first and second SG-DFB regions, A and B, have the same arrangement with those in the former LD 100.

The optical absorption region C has a function to absorb the light emitted from the SG-DFB regions, A and B; while, the SOA region D may amplify the light emitted from the SG-DFB regions, A and B. The optical modulator may modulate the light emitted from the SG-DFB regions, A and B, and amplified in the SOA region D. The optical absorption region C is put in and coupled with the second SG-DFB region B, while, the SOA region D is put in and coupled with the front side of the first SG-DFB region A. The optical modulator E may has an arrangement of, what is called as the Mach-Zender structure, and is put in and coupled with the front side of the SOA region D.

The optical absorption region C has a stack of the lower cladding layer 2, a waveguide core 13, an upper cladding layer 4, the contact layer 14 and an electrode on the substrate 1 in this order. The SOA region D has, also on the substrate 1, a stack of the lower cladding layer 2, a waveguide core, the upper cladding layer 4, a contact layer 17 and an electrode 18. The optical modulator E has, on the substrate 1, a stack of the lower cladding layer 2, a waveguide core 19, the upper cladding layer 4, a contact layer 20 and an electrode 21.

The waveguide cores, 13 and 16, may be made of a plurality of InGaAsP layers but compositions thereof are different from others. The latter core 16 may be made of a bulked InGaAsP. The waveguide core 19 in the optical modulator E constitutes one of arms of the Mach-Zender device, while the other of arms, which is not shown in FIG. 6, is also formed in the region E. The light emitted from the SOA region D is divided into respective arms, modulated in the phases thereof, and optically combined again. The waveguide core 19 includes the waveguide region 191 and the modulating region 192. The former region 191 may be made of quantum well layer with a photo-luminescence wavelength of 1.55 μm, while, the modulating region 192 may be made of bulked material with the photo-luminescence wavelength of 1.45 μm. The optical modulation may be carried out by applying an electrical signal to the electrode 21, which may cause the phase shift in the light propagating in the modulating region 192. Specifically, when the signal is applied to the electrode, the light appeared at the end of the modulating waveguides causes the phase shift by n, but no substantial shift in the phases thereof causes when no signal is applied to the electrode 21. The contact layers, 14, 17 and 21, may be made of InGaAsP.

Thus, as described above, the LD 101 provides the substrate, the lower cladding layer 2, and the upper cladding layer 4 where they are common, or continuously extends to the first SG-DFB region A, the second SG-DFB region B, the optical absorption region C, the SOA region D and the optical modulator E. The waveguide cores, 3, 13, 16, and 19 are identical in the levels thereof so as to form the single waveguide. The AR coating 11 is put on the face in the side of the optical modulator E, while, the high-reflection (HR) coating 50 is formed in the facet of the optical absorption region C.

Injecting currents from the electrode 7 to adjust the optical gain in the SG-DFB regions, A and B, concurrently with applying an electrical signal to the other electrode 8 to adjust the refractive index and driving the SOA region by injecting the current in the waveguide core 16 thereof; the light generated in the waveguide core in the SG-DFB regions, A and B, is amplified in the SOA region D. Further applying an electrical signal to the waveguide core 19 of the modulating region 192 through the electrode 21 in the optical modulator, the modulated light may be output from the front facet in the side of the optical modulator E through the AR coating 11. The light entering the waveguide core 13 in the absorption region C from the core 3 in the SG-DFB region B may be absorbed thereat in a substantial portion thereof. Moreover, because of the high reflectivity of the HR coating 50, the light barely reaching the rear facet is effectively reflected by the HR coating and returns the absorption region C. Thus, the light leaked from the rear facet may be eliminated or reduced to a substantially zero level. The HR coating 50 has a function to protect the waveguide cores, 3 and 13, from stray light coming from an outside of the LD 101. Even the stray light in a bare portion thereof may pass the HR coating; the waveguide core 13 in the absorption region C may absorb it or at least a portion of the passed light affecting the laser emission may be effectively absorbed in the absorption region C. The arrangement of the LD 101 shown in FIG. 6 has a great tolerance to the stray light.

As described above, the arrangement of the LD 101 may reduce the number of the butt-joint between the gain region 31 and the tuning region 32, which may enhance the performance and the reliability of the LD 101.

(Third Embodiment)

Figure 7:
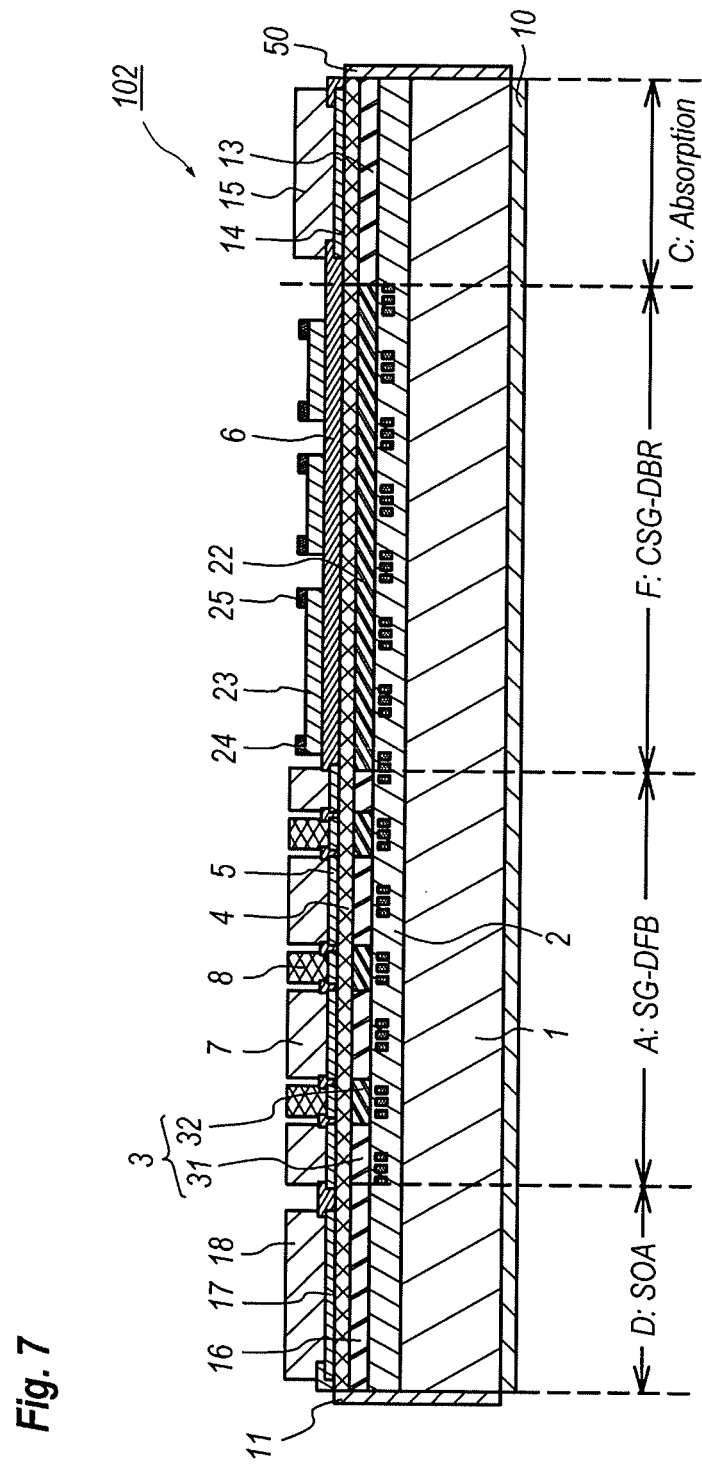
FIG. 7 is a cross section of still another tunable LD according to the third embodiment of the invention.

FIG. 7 is a cross section of still another tunable LD 102. The LD 102 shown in FIG. 7 eliminates the optical modulator E and the second SG-DFB region B appeared in the former embodiment shown in FIG. 6, but includes a chirped sampled grating distributed feedback reflector (hereafter denoted as CSG-DFB) F instead of the second SG-DFB region B. The CSG-DFB F includes, on the substrate 1, a stack of the lower cladding layer 2, a waveguide core 22, the upper cladding layer 4, the insulating film 6, and a plurality of heaters 23, where the embodiment shown in FIG. 7 includes three (3) heaters. Respective heaters, which are monolithically formed on the insulating film 6, provide an electrode 24 and a ground 25.

The substrate 1, the lower cladding layer 2, and the upper cladding layer 4 commonly and continuously extend in the first SG-DFB region A, the optical absorption region C, the SOA region D and the CSG-DBR region F. The waveguide cores, 3, 13, 16, and 22, in respective regions have the uniform bottom level, that is, the top level of the lower cladding layer 2 uniformly extends in respective regions to form the single waveguide. The AR coating 11 is formed in the front facet of the LD 102, while, the HR coating 50 is put in the rear facet.

The waveguide core 22 may be made of InGaAsP. The heater 23 may have a type of a metal thin film made of, for instance, NiCr. Each of heaters 23 may extend in several segments. Electrodes 24 for supplying current and the ground electrode 25 may be made of gold (Au) and so on. In the CSG-DBF region F, at least one segment has a length different from those of other segments, which may bring the wavelength dependence of the discrete reflection spectrum attributed to the CSG-DBR region F.

In an exemplary arrangement, the CSG-DBR region F includes three types of segments each having a specific length different from others. For instance, the lengths of the respective segment are set to be 70.8, 75.6 and 80.4 μm from the side close to the first SG-DFB region A in this order, and the pitch of the grating 9 is set to be 1.54 μm so as to show the Bragg wavelength thereof common to those segments. The waveguide core 22 of the CSG-DBR region F is made of quaternary bulk material having the peak wavelength of 1.40 µm in the photoluminescence spectrum thereof. The heater 23 may vary the equivalent refractive index of the waveguide core 22. In this arrangement, the CSG-DBR region F may include several type of groups each including a plurality of segments having the length same to each other. In this arrangement, one heater 23 may correspond to one group to control collectively the refractive index of segments within the group.

Figure 8:
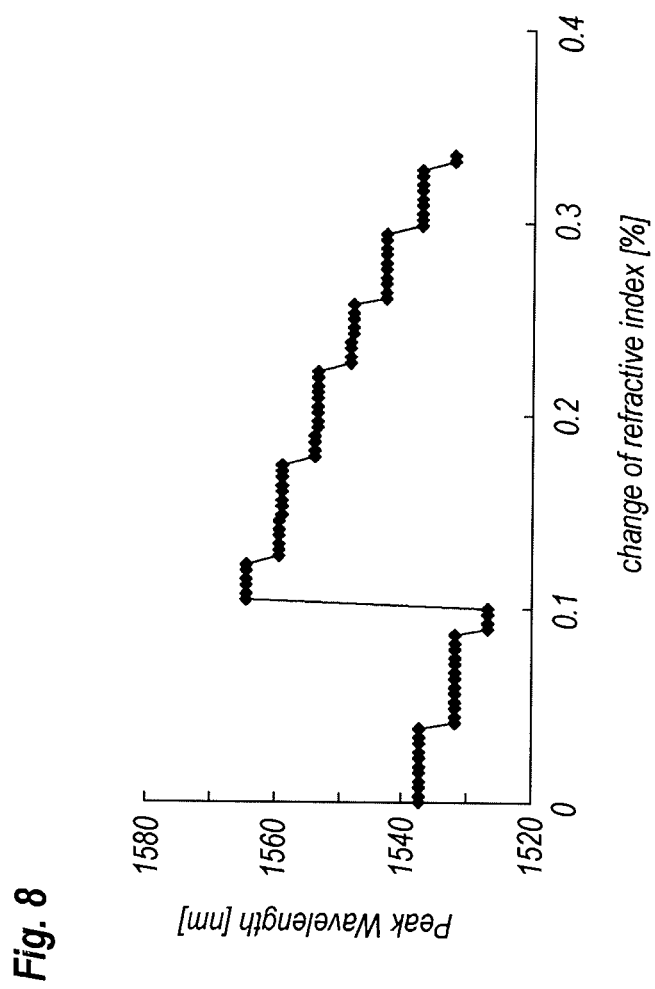
FIG. 8 shows a calculation of the peak wavelength against the change of the refractive index in the CSG-DBR region appeared in the tunable LD shown in FIG. 7.

FIG. 8 calculates the peak wavelength generated by the LD 102 that combines the SG-DFB region A and the CSG-DBR region F against the change of the refractive index of the FSG-DBR region F. FIG. 8 assumes that each segment in the CSG-DBR region F varies the refractive index by an amount equal to respective segments, and the first SG-DFB region A does not change the refractive index thereof, that is, the discrete gain peaks observed in a status when the SG-DFB region A is stand alone shown in FIG. 3 is unchanged. Several jumps for the wavelength about 6 nm appeared in FIG. 8 as varying the refractive index in the CSG-DBR region F corresponds to the shift from one gain peak to the next gain peak of the SG-DFB region A described above. When the heater 23 modifies the temperature of each segment independently, the wavelength range in which the LD 102 may tune the emission wavelength thereof may be further widened.

The LD 102 according to the present embodiment also includes the first SG-DFB region A which reduces the number of butt-joint between the gain region and the tuning region; thus, the performance and the reliability of the LD 102 may be enhanced.

The embodiment shown in FIG. 7 preferably includes a gain region 31 not the tuning region 32 at the interface to the CSG-DBR region F, because the tuning region 32 coming in contact with the CSG-DBR region F is to be necessary to tune the refractive index thereof in a way different from other tuning regions in the SG-DFB region A so as to take the correlation with the CSG-DBR region F adjacent thereto.

(Fourth Embodiment)

Figure 9:
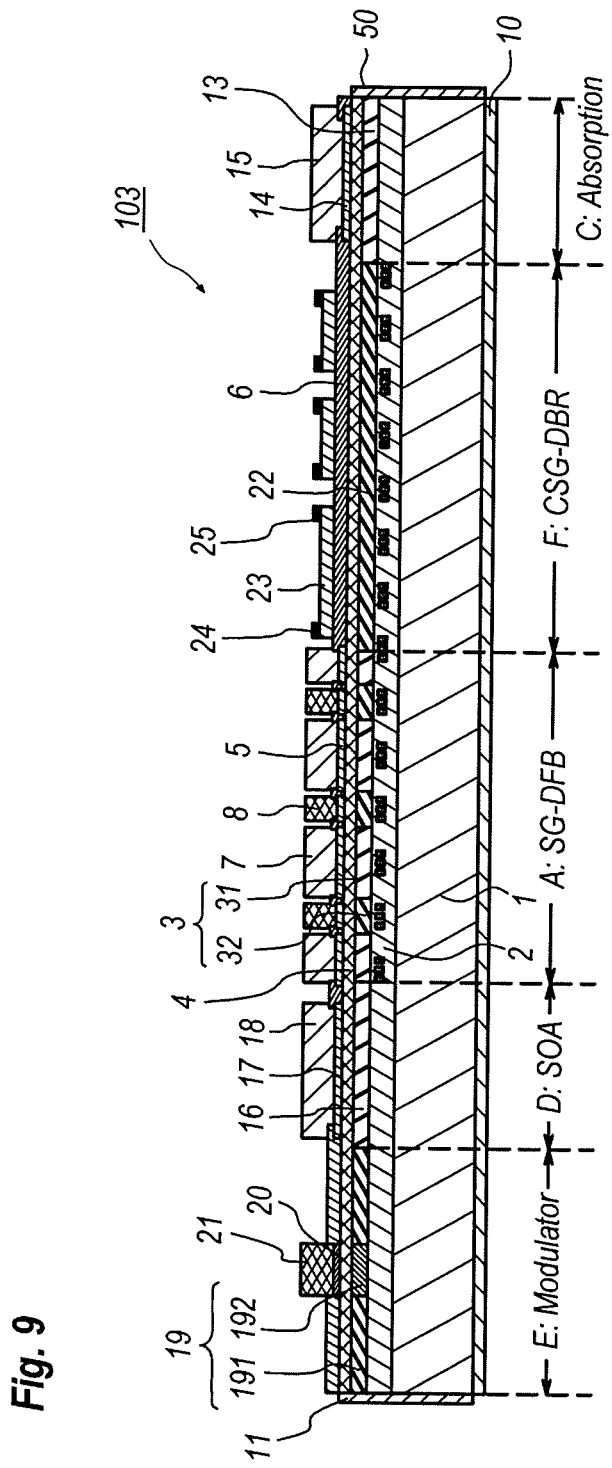
FIG. 9 is a cross section of still another tunable LD according to the fourth embodiment of the invention.

FIG. 9 is a cross section of an LD 103 according to the fourth embodiment of the present invention. The LD 103 shown in FIG. 9 includes a CSG-DBR region F instead of the second SG-DFB region B in the LD 101 illustrated in FIG. 6. The arrangement of the CSG-DBR region F is the same as those of the CSG-DBR region F of the LD 102. The LD 103 also reduces the number of the butt-joint between the gain region 31 and the tuning region 32, which may enhance the performance and the reliability of the LD 103.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor laser diode, comprising:
   a first reflector including a plurality of segments each having a space region and a grating region alternately arranged along an optical axis of said laser diode, each said grating region including a diffraction grating, and each said space region including no diffraction grating and being disposed between said grating regions, said segments forming a sampled grating;
   a first waveguide core optically coupled with said first reflector, said waveguide core including a gain region and a tuning region, said gain region including one of said grating regions, and said tuning region including another one of said grating regions neighboring said one of said grating regions included in said gain region, said one of said grating regions in said gain region and said another one of said grating regions in said tuning region having a same pitch; and
   an electrode on said tuning region, said electrode covering at least one of said space regions that is between said one of said grating regions and another one of said grating regions and that is adjacent to said another one of said grating regions,
   wherein said gain region forms a butt joint at its interface with said tuning region, and
   wherein said space region covered by said electrode has an length which varies with current injected from said electrode to determine an emission wavelength of said semiconductor laser diode.

2. The semiconductor laser diode of claim 1, wherein said tuning region has a same-length as said gain region, 3. The semiconductor laser diode of claim 1, wherein said tuning region has a relative length from 0.4 to 1.0 to a length of said gain region.

4. The semiconductor laser diode of claim 1, further comprising a second reflector optically coupled with said first reflector,
   wherein said second reflector includes a plurality of segments each having a grating region and a space region alternately arranged along said optical axis of said laser diode, and wherein
   said space regions of said second reflector have an optical length determining an emission wavelength of said semiconductor laser diode.

5. The semiconductor laser diode of claim 4, further including a second waveguide core optically coupled with said second reflector and said first waveguide core,
   wherein said second waveguide core includes a gain region and a tuning region, said gain region of said second waveguide core including one of said grating regions of said second reflector, and said tuning region of said second waveguide, core including another one of said grating regions that is adjacent to said one of said grating regions of said gain region of said second waveguide core, and
   wherein said gain region of said second waveguide core forms a butt joint at an interface with said tuning region of said second waveguide core adjacent to said grating region of said second waveguide core.

6. The semiconductor laser diode of claim 4, wherein at least one segment included in said second waveguide core has an optical length different from optical lengths of other of said segments of said second waveguide core.

7. The semiconductor laser diode of claim 1, wherein said gain region and said tuning region neighboring said gain region have a total length at least twice as large as a length of said segments.

8. A semiconductor laser diode, comprising:
a plurality of reflector segments each including a grating region having a diffraction grating and a space region having no diffraction grating whereby, said plurality of reflector segments provides plural diffraction gratings, said diffraction gratings having a common pitch, said grating regions and said space regions being alternately arranged along an optical axis of said laser diode, each said grating region and said space region forming a sampled grating;

a waveguide core optically coupled with said reflector segments, said waveguide core including a plurality of gain regions and a plurality of tuning regions each alternately arranged along the optical axis of said laser diode, each of said gain regions forming a butt joint at an interface against one of said tuning regions adjacent to said grating region, wherein each of said gain regions includes one of said grating regions and each of said tuning regions includes another one of said grating regions adjacent to said one of said grating regions in said gain region, and wherein said tuning regions have electrodes covering, in each of said tuning regions, at least said another one of said grating regions adjacent to said one of said grating regions in said gain region and one of said space regions, whereby said one space region varies in optical length in response to currents injected from one of said said electrodes to determine an emission wavelength of said semiconductor laser diode.

9. The semiconductor laser diode of claim 8, wherein said gain region and said tuning region have a total length at least double the length of one said reflector segment.

10. A wavelength tunable laser diode (LD), comprising:
a plurality of first reflector segments each including a grating region having a diffraction grating and a space region having no diffraction grating;
a first waveguide core optically coupled with said first reflector segments, said first waveguide core including a gain region and a tuning region adjacent to said gain region, said gain region including one of said grating regions, said tuning region including another one of said grating regions adjacent to said one of said grating regions in said gain region, said gain region forming a butt joint at an interface with said tuning region adjacent to said gain region, said diffraction, grating in said one of said grating region in said gain region having a same pitch as said diffraction grating in said another one of said grating regions in said tuning region, and said tuning region having an electrode covering at least one of said space regions that is provided between said one of said rating regions in said gain region and said another one of said grating regions in said tuning region,
a plurality of second reflector segments each including a grating region having a diffraction grating and a space region having no diffraction grating; and
a second waveguide core optically coupled with said second reflector segments, said second waveguide core including a gain region and a tuning region adjacent to said gain region of said second waveguide core, said gain region of said second waveguide core including one of said grating regions of said second reflector segments, said tuning region of said second waveguide core including another one of said grating regions of said second reflector segments, said gain region of said second waveguide core forming a butt joint at an interface with said tuning region of said second waveguide core,
wherein said space regions of said first reflector segments differ in optical length from of said space regions of said second reflector segments in response to current injected at said electrode.

11. A tunable laser diode (LD), comprising:
a first plurality of grating regions and space regions alternately arranged along an optical axis of said tunable LD, said grating regions and said space regions of said first plurality constituting a first plurality of segments of a first reflector with a specific optical length by coupling one of said grating regions and one of said space regions neighboring said one grating region;
a waveguide core optically coupled with said first reflector, said waveguide core including a gain region and a tuning region adjacent to said gain region, said gain region including one of said grating regions, said tuning region including another one of said grating regions adjacent to said grating region in said gain region;
an electrode covering at least one of said regions that is provided between said one of said grating regions in said gain region and another one of said grating regions in said tuning region, said diffraction grating in said one of said grating regions in said gain region having a same pitch as said diffraction gratin in said another one of said grating regions in said tuning region, said specific optical length of said first reflector being varied by a current injected from said electrode into said at least one of said regions; and
a second plurality of grating regions and space regions alternately arranged along said optical axis, said second plurality of grating regions and space regions constituting a second plurality of segments of a second reflector with another specific optical length by coupling one of said grating regions of said second plurality and one of said space regions thereof neighboring said one another grating region of said second plurality,
wherein said specific optical length of said first reflector and said another specific optical length of said second reflector tune an emission wavelength of said tunable LD.

12. The tunable LD of claim 11,
wherein all of said segments of said first plurality have said specific optical length,
wherein all of said segments of said second plurality have said another specific optical length, and
wherein said another specific optical length is equal to said specific optical length.

13. The tunable LD of claim 11,
wherein all of said segments of said first plurality have said specific optical length, and
wherein all of said segments of said second plurality have said another specific optical length, and
wherein said another specific optical length is different from said specific optical length.

14. The tunable LD of claim 11,
wherein all of said segments of said first plurality have said specific optical length, and
wherein at least one of said segments of said second plurality has a specific optical length which is different from said another optical length, 15. The tunable LD of claim 14,
further including a heater to vary optical length.

16. The tunable LD of claim 11,
wherein said tuning region has a length from 0.4 to 1.0 relative to a length of said gain region.

17. The tunable LD of claim 11,
wherein said first plurality of grating regions and space regions, said second plurality of grating regions and space regions, and said waveguide core are formed on a common semiconductor substrate.

* * * * *